United States Patent
Jiang et al.

(10) Patent No.: US 9,698,166 B2
(45) Date of Patent: Jul. 4, 2017

(54) THIN FILM TRANSISTOR, METHOD FOR MANUFACTURING THIN FILM TRANSISTOR, ARRAY SUBSTRATE, METHOD FOR MANUFACTURING ARRAY SUBSTRATE, AND DISPLAY DEVICE

(71) Applicant: BOE TECHNOLOGY GROUP CO., LTD., Beijing (CN)

(72) Inventors: Chunsheng Jiang, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/424,721

(22) PCT Filed: Apr. 16, 2014

(86) PCT No.: PCT/CN2014/075499
§ 371 (c)(1),
(2) Date: Feb. 27, 2015

(87) PCT Pub. No.: WO2015/089964
PCT Pub. Date: Jun. 25, 2015

(65) Prior Publication Data
US 2016/0035756 A1    Feb. 4, 2016

(30) Foreign Application Priority Data
Dec. 18, 2013 (CN) .......................... 2013 1 0701255

(51) Int. Cl.
*H01L 29/786* (2006.01)
*H01L 21/027* (2006.01)
(Continued)

(52) U.S. Cl.
CPC ........ *H01L 27/1225* (2013.01); *H01L 27/127* (2013.01); *H01L 29/66969* (2013.01); *H01L 29/7869* (2013.01)

(58) Field of Classification Search
CPC ............... H01L 27/127; H01L 27/1214; H01L 27/1248; H01L 27/1222; H01L 27/1251;
(Continued)

(56) References Cited

U.S. PATENT DOCUMENTS

2007/0040174 A1*   2/2007   Kim .................... H01L 27/1214
    257/59
2009/0206346 A1   8/2009   Long et al.
(Continued)

FOREIGN PATENT DOCUMENTS

CN    101794049 A    8/2010
CN    102629588 A    8/2012
(Continued)

OTHER PUBLICATIONS

First Office Action regarding Chinese application No. 201310701255.6, dated Dec. 1, 2015. Translation provided by Dragon Intellectual Property Law Firm.
(Continued)

*Primary Examiner* — Natalia Gondarenko
(74) *Attorney, Agent, or Firm* — Harness, Dickey & Pierce, P.L.C.

(57) ABSTRACT

The present disclosure relates to the field of display technology, and provides a TFT, a method for manufacturing the TFT, an array substrate, a method for manufacturing the array substrate, and a display device. The method for manufacturing the TFT includes a step of forming a pattern including a source electrode, a drain electrode and an active layer by a single patterning process, wherein the source electrode, the drain electrode and the active layer are
(Continued)

arranged at an identical layer, and the active layer is arranged between the source electrode and the drain electrode.

6 Claims, 5 Drawing Sheets

(51) Int. Cl.
*H01L 21/265* (2006.01)
*H01L 27/12* (2006.01)
*H01L 29/66* (2006.01)
*H01L 21/02* (2006.01)

(58) Field of Classification Search
CPC ............ H01L 27/1262; H01L 27/1288; H01L 27/1259; H01L 29/7869; H01L 29/45; H01L 29/518; H01L 29/78606; H01L 29/786; H01L 29/4908; H01L 33/44; H01L 33/52; H01L 28/60; H01L 21/02554; H01L 21/441; H01L 21/02565; H01L 21/47573; H01L 29/41733; H01L 29/78696; H01L 29/42384; H01L 27/3262; H01L 27/3276; H01L 51/0023; H01L 51/5234; H01L 51/5237; H01L 51/5253; H01L 29/66969; H01L 29/78693; H01L 27/1225; H01L 21/426; H01L 21/467; H01L 21/027; H01L 21/32139; H01L 21/265; H01L 21/2652; H01L 21/26513; H01L 21/26559; H01L 21/266; H01L 21/3215; H01L 51/0021; H01L 51/5218; H01L 51/56

USPC ........... 257/43, 98, 99; 438/34, 104, 151, 23
See application file for complete search history.

(56) References Cited

U.S. PATENT DOCUMENTS

| | | | |
|---|---|---|---|
| 2011/0069247 A1* | 3/2011 | Zhou | G02F 1/136227 349/43 |
| 2012/0270142 A1* | 10/2012 | Lee | G03F 7/0007 430/7 |
| 2012/0280234 A1* | 11/2012 | Koezuka | H01L 29/78606 257/57 |
| 2014/0145179 A1* | 5/2014 | Yoon | H01L 29/66969 257/43 |
| 2015/0021592 A1* | 1/2015 | Seo | H01L 29/7869 257/43 |
| 2015/0069378 A1* | 3/2015 | Cha | H01L 27/1225 257/43 |

FOREIGN PATENT DOCUMENTS

| | | | | |
|---|---|---|---|---|
| CN | 102636927 A | | 8/2012 | |
| CN | 102651343 A | | 8/2012 | |
| CN | 102810558 A | | 12/2012 | |
| CN | 103295962 A | | 9/2013 | |
| CN | 103700707 A | | 4/2014 | |
| KR | 20150030033 A | * | 3/2015 | ......... H01L 27/1225 |

OTHER PUBLICATIONS

Written Opinion of the International Searching Authority for international application No. PCT/CN2014/075499.

* cited by examiner

THIN FILM TRANSISTOR, METHOD FOR MANUFACTURING THIN FILM TRANSISTOR, ARRAY SUBSTRATE, METHOD FOR MANUFACTURING ARRAY SUBSTRATE, AND DISPLAY DEVICE

CROSS-REFERENCE TO RELATED APPLICATIONS

The present application is the U.S. national phase of PCT Application No. PCT/CN2014/075499 filed on Apr. 16, 2014, which claims priority to Chinese Patent Application No. 201310701255.6 filed on Dec. 18, 2013, the disclosures of which are incorporated in their entirety by reference herein.

TECHNICAL FIELD

The present disclosure relates to the field of display technology, in particular to a thin film transistor (TFT), a method for manufacturing the TFT, an array substrate including the TFT, a method for manufacturing the array substrate, and a display device including the array substrate.

BACKGROUND

Currently, there exists a trend for a flat-panel display device, such as a liquid crystal display (LCD) device and an organic light-emitting diode (OLED) display device, to be of a large size and a high resolution. For a thin film transistor (TFT) which serves as a critical control member in a flat-panel display industry, its performance becomes more and more important. An oxide TFT has carrier mobility up to 10 cm²/Vs, about 10 times the carrier mobility of an a-Si TFT. Moreover, the oxide TFT may be manufactured by sputtering, and merely a material capable of changing its target is required to be introduced, without any need to change an existing production line.

Generally, a bottom-gate oxide TFT may be manufactured by the following method.

Referring to FIG. 1, which is a flow chart of a method for manufacturing a bottom-gate TFT of an OLED array substrate in the related art, each pixel unit of the OLED array substrate includes two TFTs, i.e., a switching TFT and a driving TFT. A drain electrode of the switching TFT is required to be electrically connected to a gate electrode of the driving TFT. As shown in FIG. 1, the method for manufacturing the bottom-gate TFT of the OLED array substrate includes seven patterning processes, i.e., seven masks are used. For example, the method includes the following Steps S11 to S17.

Step S11: forming a gate electrode 102 of the switching TFT and a gate electrode 102' of the driving TFT on a base substrate 101, and depositing a gate insulating layer (GI) 103 on the gate electrode 102 and the gate electrode 102'. A procedure of forming the gate electrode 102 and the gate electrode 102' includes forming a gate electrode layer film, and then forming a pattern including the gate electrode 102 and the gate electrode 102' by a single patterning process (1Mask).

Step S12: forming an active layer 104 on the gate insulating layer 103. The active layer may be made of IGZO. A procedure of forming the active layer 104 includes forming an active layer film and then forming a pattern including the active layer by a single patterning process (2Mask).

Step S13: forming an etch stop layer (ESL) 105 on the active layer 104. A procedure of forming the ESL 105 includes forming an ESL film and then forming a pattern including the ESL 105 by a single patterning process (3Mask).

Step S14: forming an aperture on the gate insulating layer 103 above the gate electrode of the driving TFT so as to connect the gate electrode 102' of the driving TFT and a subsequently-formed drain electrode of the switching TFT. A procedure of forming the aperture includes forming a gate insulating layer pattern including the aperture by a single patterning process (4Mask).

Step S15: forming a source electrode 1061 and a drain electrode 1062 on the resultant base substrate. A procedure of forming the source electrode 1061 and the drain electrode 1062 includes forming a source/drain layer film, and then forming a pattern including the source electrode 1061 and the drain electrode 1062 by a single patterning process (5Mask).

Step S16: depositing a protective layer (PVX) 107, and forming an aperture on the protective layer 107 above the drain electrode 1062 of the switching TFT and the gate electrode of the driving TFT so as to connect the gate electrode 102' of the driving TFT and the drain electrode 1062 of the switching TFT. A procedure of forming the aperture includes forming a protective layer pattern including the aperture by a single patterning process (6Mask).

Step S17: forming a conductive pattern 108 on the protective layer 107. The conductive pattern may be made of ITO. A procedure of forming the conductive pattern 108 includes forming a transparent conductive film, and then forming a pattern including the conductive pattern 108 by a single patterning process (7Mask).

Referring to FIG. 2, which is another flow chart showing a method for manufacturing a bottom-gate TFT of an OLED array substrate in the related art, the method includes six patterning processes, i.e., six masks are used. For example, the method includes the following steps S21 to S26.

Step S21: forming a gate electrode 202 of the switching TFT and a gate electrode 202' of the driving TFT on a base substrate 201, and depositing a gate insulating layer (GI) 203 on the gate electrode 202 and the gate electrode 202'. A procedure of forming the gate electrode 202 and the gate electrode 202' includes forming a gate electrode layer film, and then forming a pattern including the gate electrode 202 and the gate electrode 202' by a single patterning process (1Mask).

Step S22: forming an active layer 204 on the gate insulating layer 203. A procedure of forming the active layer 204 includes forming an active layer film, and then forming a pattern including the active layer by a single patterning process (2Mask).

Step S23: forming an etch stop layer 205 on the active layer 204. A procedure of forming the etch stop layer 205 includes forming an etch stop layer film, and then forming a pattern including the etch stop layer 205 by a single patterning process (3Mask).

Step S24: forming a source electrode 2061 and a drain electrode 2062. A procedure of forming the source electrode 2061 and the drain electrode 2062 includes forming a source/drain layer film, and then forming a pattern including the source electrode 2061 and the drain electrode 2062 by a single patterning process (4Mask).

Step S25: forming a protective layer 207, etching a via-hole in the protective layer 207, etching off the gate insulating layer 203 on the gate electrode 202' of the driving TFT, on the premise of preventing a metal of the drain electrode 2062 of the switching TFT from being etched, by means of different etching rates for different metals in an atmosphere used by dry etching, and forming an aperture for connecting the gate electrode 202' of the driving TFT and the drain electrode 2062 of the switching TFT.

Step S26: forming a conductive pattern 208 on the protective layer 207. A procedure of forming the conductive pattern 208 includes forming a transparent conductive film, and then forming a pattern including the conductive pattern 208 by a single patterning process (6Mask).

In the above-mentioned two methods, six or seven patterning processes are required to be performed so as to manufacture the TFT, so the procedures are very complex.

SUMMARY

An object of the present disclosure is to provide a TFT, a method for manufacturing the TFT, an array substrate, a method for manufacturing the array substrate, and a display device, so as to reduce complexity in an existing procedure for manufacturing the TFT.

In one aspect, embodiments of the present disclosure provide a method for manufacturing a TFT, including a step of forming a pattern including a source electrode, a drain electrode and an active layer by a single patterning process, wherein the source electrode, the drain electrode and the active layer are arranged at an identical layer, and the active layer is arranged between the source electrode and the drain electrode.

In an example, the step of forming the pattern including the source electrode, the drain electrode and the active layer by a single patterning process includes:
   forming a metal oxide conductor film;
   forming a photoresist layer covering the metal oxide conductor film, and exposing and developing the photoresist layer with a halftone mask, so as to form a photoresist reserved region corresponding to a source electrode region and a drain electrode region, a photoresist half-reserved region corresponding to an active layer region, and a photoresist unreserved region;
   etching the metal oxide conductor film so as to remove the metal oxide conductor film at the photoresist unreserved region;
   subjecting the metal oxide conductor film to ion implantation, so as to enable the metal oxide conductor film corresponding to the active layer region to form a semiconductor and thereby form the active layer, wherein the source electrode and the drain electrode are protected by a photoresist and thus remain as conductors; and
   removing the photoresist so as to expose the source electrode, the drain electrode and the active layer between the source electrode and the drain electrode.

In another example, the step of forming the pattern including the source electrode, the drain electrode and the active layer by a single patterning process includes:
   forming a metal oxide semiconductor film;
   forming a photoresist layer covering the metal oxide semiconductor film, and exposing and developing the photoresist layer with a halftone mask so as to form a photoresist half-reserved region corresponding to a source electrode region and a drain electrode region, a photoresist reserved region corresponding to an active layer region, and a photoresist unreserved region;
   etching the metal oxide semiconductor film so as to remove the metal oxide semiconductor film at the photoresist unreserved region;
   subjecting the metal oxide semiconductor film to ion implantation, so as to enable the metal oxide semiconductor film corresponding to the source electrode region and the drain electrode region to form a conductor and thereby form the source electrode and the drain electrode, wherein the active layer is protected by a photoresist and thus remains as a semiconductor; and
   removing the photoresist so as to expose the source electrode, the drain electrode and the active layer between the source electrode and the drain electrode.

In yet another example, prior to forming the metal oxide conductor film or the metal oxide semiconductor film, the method further includes:
   forming a pattern of a gate electrode on the base substrate by a single patterning process;
   forming a gate insulating layer on the gate electrode; and
   forming the metal oxide conductor film or the metal oxide semiconductor film on the gate insulating layer.

In another aspect, embodiments of the present disclosure provide a method for manufacturing a TFT array substrate, including a step of forming a pattern including a source electrode, a drain electrode, a pixel electrode and an active layer by a single patterning process, wherein the source electrode, the drain electrode, the pixel electrode and the active layer are arranged at an identical layer, and the active layer is arranged between the source electrode and the drain electrode.

In an example, the step of forming the pattern including the source electrode, the drain electrode, the pixel electrode and the active layer by a single patterning process includes:
   forming a metal oxide conductor film;
   forming a photoresist layer covering the metal oxide conductor film, and exposing and developing the photoresist layer with a halftone mask, so as to form a photoresist reserved region corresponding to a source electrode region, a drain electrode region and a pixel electrode region, a photoresist half-reserved region corresponding to an active layer region, and a photoresist unreserved region;
   etching the metal oxide conductor film so as to remove the metal oxide conductor film at the photoresist unreserved region;
   subjecting the metal oxide conductor film to ion implantation, so as to enable the metal oxide conductor film corresponding to the active layer region to form a semiconductor and thereby form the active layer, wherein the source electrode, the drain electrode and the pixel electrode are protected by a photoresist and thus remain as conductors; and
   exposing, developing and curing the photoresist layer, reserving the photoresist at the source electrode region, the drain electrode region and the active layer region so as to form a protective layer, and removing the photoresist at the pixel electrode region.

In another example, the step of forming the pattern including the source electrode, the drain electrode, the pixel electrode and the active layer by a single patterning process includes:
   forming a metal oxide semiconductor film;
   forming a photoresist layer covering the metal oxide semiconductor film, and exposing and developing the photoresist layer with a halftone mask so as to form a photoresist half-reserved region corresponding to a source electrode region, a drain electrode region and a pixel electrode region, a photoresist reserved region corresponding to an active layer region, and a photoresist unreserved region;

etching the metal oxide semiconductor film so as to remove the metal oxide semiconductor film at the photoresist unreserved region;

subjecting the metal oxide semiconductor film to ion implantation, so as to enable the metal oxide semiconductor film corresponding to the source electrode region, the drain electrode region and the pixel electrode region to form a conductor and thereby form the source electrode, the drain electrode and the pixel electrode, wherein the active layer is protected by a photoresist and thus remains as a semiconductor; and exposing, developing and curing the photoresist layer, reserving the photoresist at the source electrode region, the drain electrode region and the active layer region so as to form a protective layer, and removing the photoresist at the pixel electrode region.

In yet another example, prior to forming the metal oxide conductor film or the metal oxide semiconductor film, the method further includes:

forming a pattern of a gate electrode on the base substrate by a single patterning process;

forming a gate insulating layer on the gate electrode; and forming the metal oxide conductor film or the metal oxide semiconductor film on the gate insulating layer.

In yet another aspect, embodiments of the present disclosure provide a TFT, including a gate electrode, a gate insulating layer, an active layer, a source electrode and a drain electrode, wherein the active layer is arranged at a layer identical to the source electrode and the drain electrode, and arranged between the source electrode and the drain electrode.

In one example, the active layer is made of a metal oxide semiconductor material, and the source electrode and the drain electrode are made of a metal oxide conductor material.

In another example, the active layer is formed by subjecting the metal oxide conductor film at a region between the source electrode and the drain electrode to ion implantation, or the source electrode and the drain electrode are formed by subjecting the metal oxide semiconductor film at regions at both sides of the active layer to ion implantation.

In still yet another aspect, embodiments of the present disclosure provide a TFT array substrate, including a gate electrode, a gate insulating layer, an active layer, a source electrode, a drain electrode and a pixel electrode, wherein the active layer is arranged at a layer identical to the source electrode, the drain electrode and the pixel electrode.

In one example, the active layer is made of a metal oxide semiconductor material, and the source electrode, the pixel electrode and the drain electrode are made of a metal oxide conductor material.

In another example, the active layer is formed by subjecting the metal oxide conductor film at a region between the source electrode and the drain electrode to ion implantation, or the source electrode, the pixel electrode and the drain electrode are formed by subjecting the metal oxide semiconductor film at regions at both sides of the active layer to ion implantation.

In yet another example, the array substrate includes:

a base substrate;

the gate electrode formed on the base substrate;

the gate insulating layer formed on the gate electrode;

the active layer, the source electrode, the drain electrode and the pixel electrode formed on the gate insulating layer; and a protective layer formed above the active layer, the source electrode and the drain electrode.

In still yet another aspect, embodiments of the present disclosure provide a display device including the above-mentioned TFT array substrate.

The present disclosure has the following advantageous effects. According to the present disclosure, the patterns of the source electrode, the drain electrode and active layer of the TFT are formed by a single patterning process, and as a result it is able to reduce the number of the patterning processes desired for manufacturing the TFT, thereby to simplify the manufacture procedure thereof. In addition, the patterns of the source electrode, the drain electrode, the pixel electrode and the active layer of the TFT array substrate are formed by a single patterning process, and as a result, it is able to reduce the number of the patterning processes desired for manufacturing the TFT array substrate, thereby to simplify the manufacture procedure thereof.

DETAILED DESCRIPTION

Figure 1:
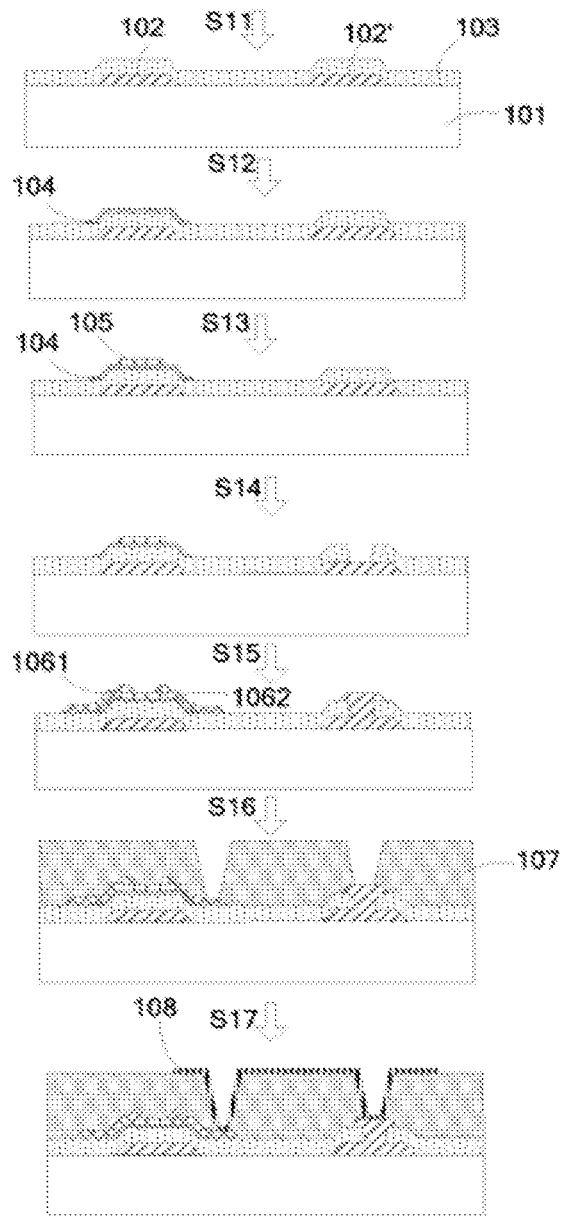
FIG. 1 is a flow chart showing a method for manufacturing a bottom-gate TFT of an OLED array substrate in the related art.
Figure 2:
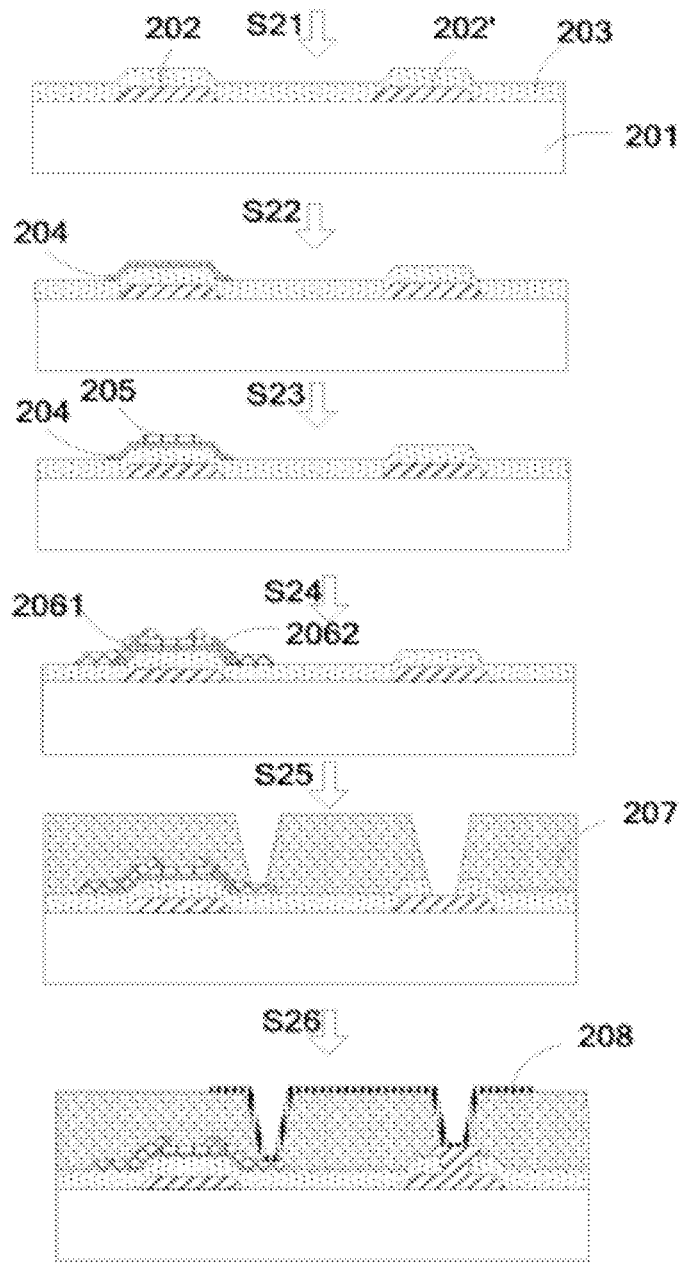
FIG. 2 is another flow chart showing a method for manufacturing a bottom-gate TFT of an OLED array substrate in the related art.

In a first aspect embodiments of the present disclosure, there is provided a method for manufacturing a TFT, which includes a step of forming a pattern including a source electrode, a drain electrode and an active layer by a single patterning process, wherein the source electrode, the drain electrode and the active layer are arranged at an identical layer, and the active layer is arranged between the source electrode and the drain electrode.

To be specific, the source electrode, the drain electrode and the active layer may be formed at the identical layer in the following two ways.

(1) The step of forming the pattern including the source electrode, the drain electrode and the active layer by a single patterning process may include the following Steps A1 to E1:

Step A1: forming a metal oxide conductor film;

Step B1: forming a photoresist layer covering the metal oxide conductor film, and exposing and developing the photoresist layer with a halftone mask, so as to form a photoresist reserved region corresponding to a source electrode region and a drain electrode region, a photoresist half-reserved region corresponding to an active layer region, and a photoresist unreserved region, wherein after the exposing and developing, a thickness of the photoresist layer at the source electrode region and the drain electrode region is greater than that of the photoresist layer at the active layer region;

Step C1: etching the metal oxide conductor film so as to remove the metal oxide conductor film at the photoresist unreserved region;

Step D1: subjecting the metal oxide conductor film to ion implantation, so as to enable the metal oxide conductor film corresponding to the active layer region to form a semiconductor and thereby form the active layer, wherein the source electrode and the drain electrode are protected by a photoresist and thus remain as conductors, and wherein the source electrode region and the drain electrode region are blocked by the photoresist layer during the ion implantation due to the larger thickness of the photoresist layer at the source electrode region and the drain electrode region, and metal elements are implanted into the metal oxide conductor film at the active layer region due to the smaller thickness of the photoresist layer at the active layer region, so as to form the semiconductor; and Step E1: removing the photoresist so as to expose the source electrode, the drain electrode and the active layer between the source electrode and the drain electrode.

(2) The step of forming the pattern including the source electrode, the drain electrode and the active layer by a single pattering process may include the following Steps SA2 to E2:

Step A2: forming a metal oxide semiconductor film;

Step B2: forming a photoresist layer covering the metal oxide semiconductor film, and exposing and developing the photoresist layer with a halftone mask so as to form a photoresist half-reserved region corresponding to a source electrode region and a drain electrode region, a photoresist reserved region corresponding to an active layer region, and a photoresist unreserved region, wherein after the exposing and developing, a thickness of the photoresist layer at the active layer is greater than that of the photoresist layer at the source electrode region and the drain electrode region;

Step C2: etching the metal oxide semiconductor film so as to remove the metal oxide semiconductor film at the photoresist unreserved region;

Step D2: subjecting the metal oxide semiconductor film to ion implantation, so as to enable the metal oxide semiconductor film corresponding to the source electrode region and the drain electrode region to form a conductor and thereby form the source electrode and the drain electrode, wherein the active layer is protected by a photoresist and thus remains as a semiconductor, and wherein the active layer region is blocked by the photoresist layer during the ion implantation due to the larger thickness of the photoresist layer at the active layer region, and metal elements are implanted into the metal oxide semiconductor film at the source electrode region and the drain electrode region due to the smaller thickness of the photoresist layer at the source electrode region and the drain electrode region, so as to form the conductor; and Step E2: removing the photoresist so as to expose the source electrode, the drain electrode and the active layer between the source electrode and the drain electrode.

In the above embodiments, the metal oxide may be, e.g., Indium Zinc Oxide (IZO), Indium Tin Oxide (ITO), Zinc Oxide (ZnO) or Tin Oxide (SnO), etc.; the metal for the ion implantation may be, e.g., tin (Sn) or zinc (Zn), etc.; and the photoresist may be, e.g., resin.

In addition, in the above embodiments, prior to forming the metal oxide conductor film or the metal oxide semiconductor film, the method further includes: forming a pattern of a gate electrode on the base substrate by a single patterning process; forming a gate insulating layer on the gate electrode; and forming the metal oxide conductor film or the metal oxide semiconductor film on the gate insulating layer.

As can be seen from the above, in the method according to embodiments of the present disclosure, the TFT may be manufactured by merely two patterning processes. As a result, it is able to reduce the number of the patterning processes, thereby to simplify the manufacture procedure thereof.

In a second aspect embodiments of the present disclosure, there is provided a method for manufacturing a TFT array substrate, which includes a step of forming a pattern including a source electrode, a drain electrode, a pixel electrode and an active layer by a single patterning process. The source electrode, the drain electrode, the pixel electrode and the active layer are arranged at an identical layer, and the active layer is arranged between the source electrode and the drain electrode.

To be specific, the source electrode, the drain electrode, the pixel electrode and the active layer may be formed at the identical layer in the following two ways.

(1) The step of forming the pattern including the source electrode, the drain electrode, the pixel electrode and the active layer by a single patterning process may include the following Steps A3 to E3:

Step A3: forming a metal oxide conductor film;

Step B3: forming a photoresist layer covering the metal oxide conductor film, and exposing and developing the photoresist layer with a halftone mask, so as to form a photoresist reserved region corresponding to a source electrode region, a drain electrode region and a pixel electrode region, a photoresist half-reserved region corresponding to an active layer region, and a photoresist unreserved region, wherein after the exposing and developing, a thickness of the photoresist layer at the source electrode region, the pixel electrode region and the drain electrode region is greater than that of the photoresist layer at the active layer region;

Step C3: etching the metal oxide conductor film so as to remove the metal oxide conductor film at the photoresist unreserved region;

Step D3: subjecting the metal oxide conductor film to ion implantation, so as to enable the metal oxide conductor film corresponding to the active layer region to form a semiconductor and thereby form the active layer, wherein the source electrode, the pixel electrode and the drain electrode are protected by a photoresist and thus remain as conductors, and wherein the source electrode region, the pixel electrode region and the drain electrode region are blocked by the photoresist layer during the ion implantation due to the larger thickness of the photoresist layer at the source electrode region, the pixel electrode region and the drain electrode region, and metal elements are implanted into the metal oxide conductor film at the active layer region due to the smaller thickness of the photoresist layer at the active layer region, so as to form the semiconductor; and Step E3: exposing, developing and curing the photoresist layer, reserving the photoresist at the source electrode region, the drain electrode region and the active layer so as to form a protective layer, and removing the photoresist at the pixel electrode region.

Figure 5:
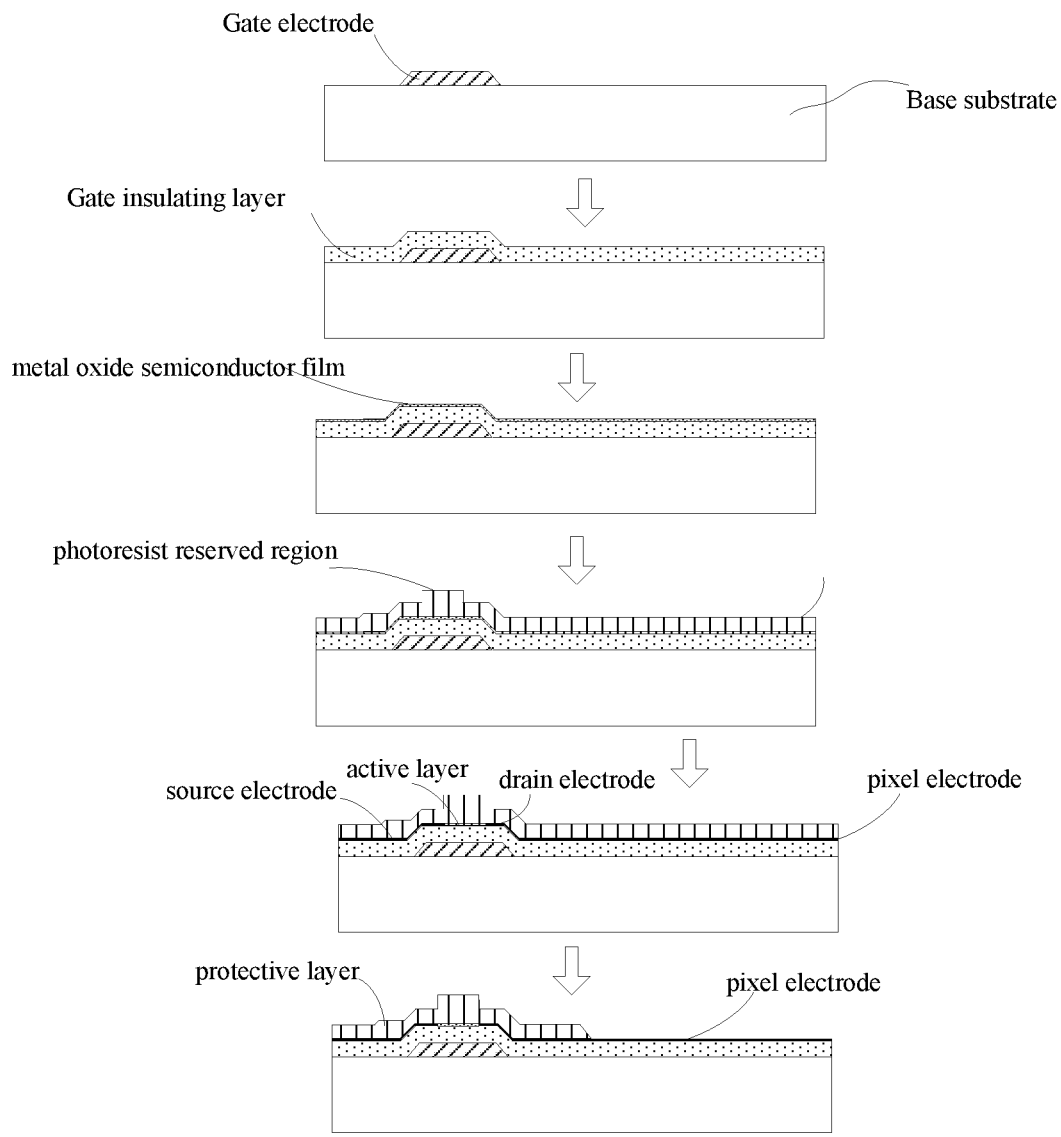
FIG. 5 is a flow chart showing a method of forming a pattern including a source electrode, a drain electrode, a pixel electrode and an active layer by a single pattering process.

The step of forming the pattern including the source electrode, the drain electrode, the pixel electrode and the active layer by a single patterning process may include the following Steps A4 to E4, as shown in FIG. 5:

Step A4: forming a metal oxide semiconductor film;

Step B4: forming a photoresist layer covering the metal oxide semiconductor film, and exposing and developing the photoresist layer with a halftone mask so as to form a photoresist half-reserved region corresponding to a source electrode region, a drain electrode region and a pixel electrode region, a photoresist reserved region corresponding to an active layer region, and a photoresist unreserved region, wherein after the exposing and developing, a thickness of the photoresist layer at the active layer is greater than that of the photoresist layer at the source electrode region, the pixel electrode region and the drain electrode region;

Step C4: etching the metal oxide semiconductor film so as to remove the metal oxide semiconductor film at the photoresist unreserved region;

Step D4: subjecting the metal oxide semiconductor film to ion implantation, so as to enable the metal oxide semiconductor film corresponding to the source electrode region, the drain electrode region and the pixel electrode region to form a conductor and thereby form the source electrode, the drain electrode and the pixel electrode, wherein the active layer is protected by a photoresist and thus remains as a semiconductor, and wherein the active layer region is blocked by the photoresist layer during the ion implantation due to the larger thickness of the photoresist layer at the active layer region, and the metal elements are implanted into the metal oxide semiconductor film at the source electrode region, the pixel electrode region and the drain electrode region due to the smaller thickness of the photoresist layer at the source electrode region, the pixel electrode region and the drain electrode region, so as to form the conductors; and Step E4: exposing, developing and curing the photoresist layer, reserving the photoresist at the source electrode region, the drain electrode region and the active layer so as to form a protective layer, and removing the photoresist at the pixel electrode region.

In the above embodiments, the curing of the photoresist layer obtained after the development refers to subjecting the photoresist layer obtained after the development to thermal treatment, so as to volatilize an organic solvent in the photoresist layer, thereby to cure the photoresist layer in a liquid form.

In the above embodiments, the metal oxide may be, e.g., Indium Zinc Oxide (IZO), Indium Tin Oxide (ITO), Zinc Oxide (ZnO) or Tin Oxide (SnO), etc.; the metal for the ion implantation may be, e.g., tin (Sn) or zinc (Zn), etc.; and the photoresist may be, e.g., resin.

In addition, in the above embodiments, prior to forming the metal oxide conductor film or the metal oxide semiconductor film, the method further includes: forming a pattern of a gate electrode on the base substrate by a single patterning process; forming a gate insulating layer on the gate electrode; and forming the metal oxide conductor film or the metal oxide semiconductor film on the gate insulating layer.

In a third aspect embodiments of the present disclosure, there is provided a TFT, which includes a gate electrode, a gate insulating layer, an active layer, a source electrode and a drain electrode, in which the active layer is arranged at a layer identical to the source electrode and the drain electrode, and arranged between the source electrode and the drain electrode.

The active layer is made of a metal oxide semiconductor material, and the source electrode and the drain electrode are made of a metal oxide conductor material.

To be specific, the active layer is formed by subjecting the metal oxide conductor film at a region between the source electrode and the drain electrode to ion implantation, or the source electrode and the drain electrode are formed by subjecting the metal oxide semiconductor film at regions at both sides of the active layer to ion implantation.

In a fourth aspect embodiments of the present disclosure, there is provided a TFT array substrate, which includes a gate electrode, a gate insulating layer, an active layer, a source electrode, a drain electrode and a pixel electrode, in which the active layer is arranged at a layer identical to the source electrode, the drain electrode and the pixel electrode.

The active layer is made of a metal oxide semiconductor material, and the source electrode, the pixel electrode and the drain electrode are made of a metal oxide conductor material.

To be specific, the active layer is formed by subjecting the metal oxide conductor film at a region between the source electrode and the drain electrode to ion implantation, or the source electrode, the pixel electrode and the drain electrode are formed by subjecting the metal oxide semiconductor film at regions at both sides of the active layer to ion implantation.

In an example, the array substrate may include:
a base substrate;
the gate electrode formed on the base substrate;
the gate insulating layer formed on the gate electrode;
the active layer, the source electrode, the drain electrode and the pixel electrode formed on the gate insulating layer; and
a protective layer formed above the active layer, the source electrode and the drain electrode.

In a fifth aspect embodiments of the present disclosure, there is provided a display device, which includes the above-mentioned TFT array substrate. Structures and working principles of the array substrate may refer to the above embodiments, which are not repeated herein. In addition, structures of the other members in the display device are known in the related, which are particularly defined herein. The display device according to embodiments of the present disclosure may be any products or members having a display function, e.g., a liquid crystal display panel, an electronic paper, an Organic Light Emitting Diode (OLED) panel, a liquid crystal TV, a liquid crystal display, a digital photo frame, a mobile phone or a flat-panel PC.

In order to make the objects, the technical solutions and the advantages of the present disclosure more apparent, the present disclosure will be described hereinafter in conjunction with the drawings and the embodiments. The method for manufacturing the TFT array substrate is described hereinafter by taking a bottom-gate TFT array substrate of an OLED array substrate as an example.

It should be appreciated that, each pixel unit of the OLED array substrate includes two TFTs, i.e., a switching TFT and a driving TFT. A drain electrode of the switching TFT is required to be electrically connected to a gate electrode of the driving TFT. For convenience, the method for manufacturing the driving TFT in the array substrate is merely described in the following embodiments. In fact, the switching TFT is formed together with the driving TFT, and its manufacturing method is similar to that for manufacturing the driving TFT, which is thus not repeated herein.

Embodiment 1

Figure 3:
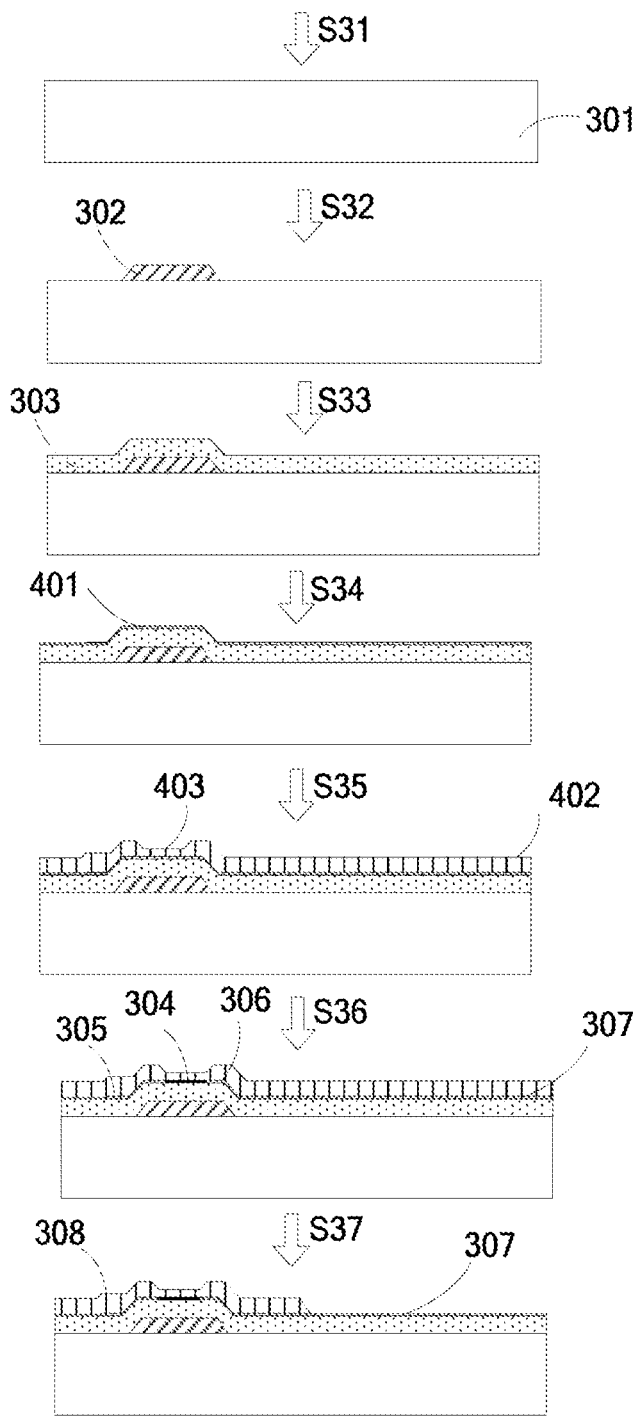
FIG. 3 is a flow chart showing a method for manufacturing a TFT array substrate according to Embodiment 1 of the present disclosure.

Referring to FIG. 3, which is a flow chart showing a method for manufacturing a bottom-gate TFT array substrate of an OLED array substrate according to Embodiment 1 of the present disclosure, the method includes the following steps.

Step S31: providing a base substrate 301.

Step S32: forming a gate electrode 302 on the base substrate 301. The gate electrode 302 may be formed by forming a gate electrode layer film, and then forming a pattern including the gate electrode 302 by a single patterning process (1Mask).

Step S33: forming a gate insulating layer (GI) 303 on the gate electrode 302, and forming an aperture (not shown) in the gate insulating layer 303 so as to connect the gate electrode 302 and a pattern of a subsequently-formed drain electrode of the switching TFT. The aperture may be formed by forming a gate insulating layer pattern including the aperture by a single patterning process (2Mask).

Step S34: forming a metal oxide conductor film 401 on the gate insulating layer 303. To be specific, the metal oxide conductor film 401, e.g., IZO, may be deposited by sputtering.

Step S35: applying a photoresist layer so as to cover the metal oxide conductor film, exposing and developing the photoresist layer with a halftone mask so as to form a photoresist reserved region 402 corresponding to a source electrode region, a drain electrode region and a pixel electrode region, a photoresist half-reserved region 403 corresponding to an active layer region, and a photoresist unreserved region (not shown), and etching the metal oxide conductor film so as to remove the metal oxide conductor film at the photoresist unreserved region. To be specific, the photoresist layer having a thickness of 1.5 μm to 2.5 μm may be spin-coated on the metal oxide conductor film 401. After the exposing and developing, a thickness of the photoresist layer at the source electrode region, the pixel electrode region and the drain electrode region is of greater than that of the photoresist layer at the active layer region. In this step, the photoresist reserved region 402 corresponding to the source electrode region, the pixel electrode region and the drain electrode region, the photoresist half-reserved region 403 corresponding to the active layer region and the photoresist unreserved region are formed by a single patterning process (3Mask).

Step S36: subjecting the metal oxide conductor film 401 into ion implantation, so as to enable the metal oxide conductor film corresponding to the active layer region to form a semiconductor and thereby to form an active layer 304, wherein a source electrode 305, a drain electrode 306 and a pixel electrode 307 are protected by a photoresist and thus remain as conductors. To be specific, a metal element for the ion implantation may, e.g., be Sn. The source electrode region, the pixel electrode region and the drain electrode region are blocked by the photoresist layer during the ion implantation due to the larger thickness of the photoresist layer at the source electrode region, the pixel electrode region and the drain electrode region, and the metal element is implanted into the metal oxide conductor film at the active layer region due to the smaller thickness of the photoresist layer at the active layer region, so as to form the semiconductor.

Step S37: exposing, developing and curing the photoresist layer, reserving the photoresist at the source electrode region, the drain electrode region and the active layer so as to form a protective layer 308, and removing the photoresist at the pixel electrode region so as to expose a pixel electrode 307. To be specific, the curing step includes subjecting the photoresist layer obtained after the exposure and development to thermal treatment for one hour at a temperature of 230° C., so as to remove an organic solvent in the photoresist layer and cure the photoresist layer, thereby to form the protective layer. The step of forming the protective layer includes forming the protective layer by a single patterning process (4Mask).

In this embodiment, the metal oxide is used as the material for forming the source electrode, the drain electrode and the pixel electrode, and formed at a surface of the gate insulating layer simultaneously. As a result, it is able to reduce the processes for depositing, exposing, developing and etching the materials for forming the source/drain electrode and the pixel electrode, thereby to reduce the number of the patterning processes. In addition, it is unnecessary to form an existing etch insulating layer, i.e., to reduce the processes for depositing, exposing, developing and etching the etch insulating layer, and meanwhile a resin layer for blocking may be used as a material of the protective layer, without any additional etching process.

Embodiment 2

Figure 4:
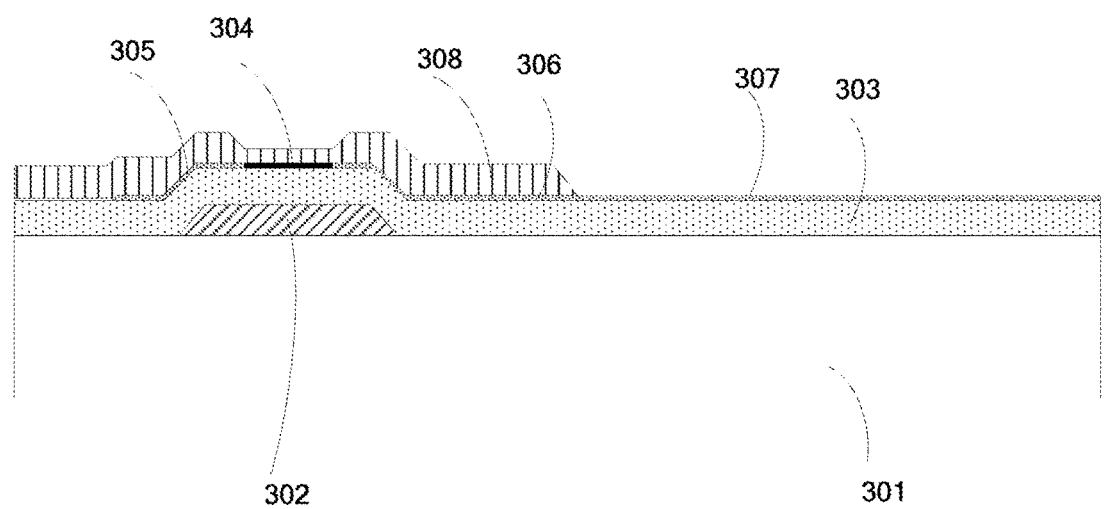
FIG. 4 is a schematic view showing a TFT array substrate according to Embodiment 2 of the present disclosure.

Referring to FIG. 4, which is a schematic view showing a TFT array substrate according to Embodiment 2 of the present disclosure, the array substrate is manufactured using the method mentioned in Embodiment 1. The TFT array substrate includes:
the base substrate 301;
the gate electrode 302 formed on the base substrate;
the gate insulating layer 303 formed on the gate electrode;
the active layer 304, the source electrode 305, the drain electrode 306 and the pixel electrode 307 formed on the gate insulating layer; and
the protective layer 308 formed above the source electrode 305 and the drain electrode 306.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing a thin film transistor (TFT), comprising steps of:
forming a pattern including a source electrode, a drain electrode and an active layer by a single patterning process,
wherein the source electrode, the drain electrode and the active layer are arranged at an identical layer, and the active layer is arranged between the source electrode and the drain electrode;
wherein the step of forming the pattern including the source electrode, the drain electrode and the active layer by a single patterning process comprises:
forming a metal oxide semiconductor film;
forming a photoresist layer covering the metal oxide semiconductor film, and exposing and developing the photoresist layer with a halftone mask so as to form a photoresist half-reserved region corresponding to a source electrode region and a drain electrode region, and a photoresist reserved region corresponding to an active layer region;
etching the metal oxide semiconductor film so as to remove the metal oxide semiconductor film outside of the photoresist half-reserved region and the photoresist reserved region;
after the step of etching the metal oxide semiconductor film so as to remove the metal oxide semiconductor film outside of the photoresist half-reserved region and the photoresist reserved region, forming a conductor corresponding to the source electrode region and the drain electrode region by implementing metal ions to the metal oxide semiconductor film, thereby forming the source electrode and the drain electrode, wherein the source electrode region and the drain electrode region are covered by the photoresist half-reserved region during the implementing metal ions, and wherein the active layer is protected by the photoresist layer at the photoresist reserved region and thus remains as a semiconductor; and removing the photoresist layer at the photoresist half-reserved region and the photoresist reserved region so as to expose the source electrode, the drain electrode and the active layer between the source electrode and the drain electrode.

2. A method for manufacturing a thin film transistor (TFT) array substrate, comprising steps of:

forming a pattern including a source electrode, a drain electrode, a pixel electrode and an active layer by a single patterning process, wherein the source electrode, the drain electrode, the pixel electrode and the active layer are arranged at an identical layer, and the active layer is arranged between the source electrode and the drain electrode;

wherein the step of forming the pattern including the source electrode, the drain electrode, the pixel electrode and the active layer by a single patterning process comprises:

forming a metal oxide semiconductor film;

forming a photoresist layer covering the metal oxide semiconductor film, and exposing and developing the photoresist layer with a halftone mask so as to form a photoresist half-reserved region corresponding to a source electrode region, a drain electrode region and a pixel electrode region, and a photoresist reserved region corresponding to an active layer region;

etching the metal oxide semiconductor film so as to remove the metal oxide semiconductor film outside of the photoresist half-reserved region and the photoresist reserved region;

after the step of etching the metal oxide semiconductor film so as to remove the metal oxide semiconductor film outside of the photoresist half-reserved region and the photoresist reserved region, subjecting the metal oxide semiconductor film to ion implantation by implementing metal ions to the metal oxide semiconductor film until the metal oxide semiconductor film corresponding to the source electrode region, the drain electrode region and the pixel electrode region forms a conductor corresponding to the source electrode region, the drain electrode region and the pixel electrode region, thereby forming the source electrode, the drain electrode and the pixel electrode, wherein the source electrode region and the drain electrode region are covered by the photoresist half-reserved region during the implementing metal ions, and wherein the active layer is protected by the photoresist layer at the photoresist reserved region and thus remains as a semiconductor; and exposing, developing and curing the photoresist layer at regions corresponding to the source electrode region, the drain electrode region and the active layer region, reserving the photoresist layer at the regions corresponding to the source electrode region, the drain electrode region and the active layer region so as to form a protective layer, and removing the photoresist layer at a region corresponding to the pixel electrode region.

3. The method according to claim 1, wherein prior to forming the metal oxide semiconductor film, the method further comprises:

forming a pattern of a gate electrode on a base substrate by a single patterning process;

forming a gate insulating layer on the gate electrode; and forming a metal oxide conductor film or the metal oxide semiconductor film on the gate insulating layer.

4. The method according to claim 2, wherein prior to forming the metal oxide semiconductor film, the method further comprises:

forming a pattern of a gate electrode on a base substrate by a single patterning process;

forming a gate insulating layer on the gate electrode; and forming a metal oxide conductor film or the metal oxide semiconductor film on the gate insulating layer.

5. The method according to claim 1, wherein the metal ions comprise tin ions or zinc ions.

6. The method according to claim 2, wherein the metal ions comprise tin ions or zinc ions.

* * * * *